(12) United States Patent
Cho et al.

(10) Patent No.: US 8,659,463 B2
(45) Date of Patent: Feb. 25, 2014

(54) SUCCESSIVE APPROXIMATION REGISTER ANALOG-TO-DIGITAL CONVERTER AND OPERATION METHOD THEREOF

(75) Inventors: Young Kyun Cho, Daejeon (KR); Jae Ho Jung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/531,418

(22) Filed: Jun. 22, 2012

(65) Prior Publication Data

US 2013/0135126 A1 May 30, 2013

(30) Foreign Application Priority Data

Nov. 25, 2011 (KR) ........................ 10-2011-0124221

(51) Int. Cl.
*H03M 1/34* (2006.01)
(52) U.S. Cl.
USPC .......................................... 341/163; 341/155
(58) Field of Classification Search
USPC .................. 341/163, 155, 133, 108, 172, 110
See application file for complete search history.

(56) References Cited

U.S. PATENT DOCUMENTS

| | | | |
|---|---|---|---|
| 4,396,905 A | 8/1983 | Chan et al. | |
| 6,329,938 B1 | 12/2001 | Spaur et al. | |
| 6,433,725 B1 | 8/2002 | Chen et al. | |
| 7,705,763 B2 | 4/2010 | Kuramochi et al. | |
| 7,741,981 B1 * | 6/2010 | Wan et al. | 341/110 |
| 7,834,793 B2 | 11/2010 | Carreau et al. | |
| 7,893,860 B2 | 2/2011 | Cho et al. | |
| 7,977,979 B2 | 7/2011 | Cho et al. | |
| 8,134,487 B2 | 3/2012 | Harpe | |

FOREIGN PATENT DOCUMENTS

KR 1020100073035 A 7/2010

OTHER PUBLICATIONS

Franz Kuttner, "A 1.2V 10b 20MSample/s Non-Binary Successive Approximation ADC in 0.13um CMOS", ISSCC 2002, Session 10, High-Speed ADCs, 2002, pp. 10.6-10.6.6, IEEE.
Shuo-Wei Michael Chen et al., "A 6-bit 600MS/s 5.3mW Asynchronous ADC in 0.13um CMOS", IEEE Journal of Solid-State Circuits, Dec. 2006, pp. 2669-2680, vol. 41, No. 12, IEEE.
Vito Giannini et al., "An 820uW 9b 40MS/s Noise-Tolerant Dynamic SAR ADC in 90nm Digital CMOS", ISSCC 2008, Session 12, 008, pp. 38-239 and 610, IEEE.
Chun-Cheng Liu et al., "A 10b 100MS/s 1.13mW SAR ADC with Binary scaled Error Compensation", ISSCC 2010, Session 21, Successive-Approximation ADCs, 2010, pp. 386-388, IEEE.

* cited by examiner

*Primary Examiner* — Joseph Lauture (57) ABSTRACT

Provided are a successive approximation register analog-to-digital converter and an operation method thereof. The method includes latching input signals which respectively correspond to bits of a first series of bits as digital data by directly transmitting the input signals to a latch; latching input signals which respectively correspond to bits of a second series of bits as digital data by transmitting the input signals to the latch after amplifying the input signals during a first period of amplification by using a preamplifier; and latching input signals which respectively correspond to bits of a third series of bits as digital data by transmitting the input signals to the latch after amplifying the input signals during a second period of amplification by using the preamplifier.

11 Claims, 6 Drawing Sheets

SUCCESSIVE APPROXIMATION REGISTER ANALOG-TO-DIGITAL CONVERTER AND OPERATION METHOD THEREOF

CROSS-REFERENCE TO RELATED APPLICATIONS

This U.S. non-provisional patent application claims priority under 35 U.S.C. §119 of Korean Patent Application No. 10-2011-0124221, filed on Nov. 25, 2011, the entire contents of which are hereby incorporated by reference.

BACKGROUND OF THE INVENTION

The present invention disclosed herein relates to an analog-to-digital converter, and more particularly, to a successive approximation register analog-to-digital converter and an operation method thereof.

As the use of mixed-mode systems increases, analog-to-digital converters (ADC) become more important. In particular, to reduce the prices of digital video disk players (DVDP) and direct broadcasting for satellite receiver (DRSR) systems, research has been actively conducted on methods of integration into one chip via a CMOS process. One of the most important issues for integration into one chip is how to design an ADC capable of directly processing a radio frequency (RF) signal.

Various types of ADCs have been proposed to date. For instance, a flash ADC, a pipeline ADC, and a successive approximation register (SAR) ADC have been proposed, and are currently used in fields suitable for ADCs. A flash ADC operates at relatively high speed, but consumes a large amount of power. A pipeline ADC operates at high speed and supports high resolution, but occupies a large area. A SAR ADC consumes a small amount of power and has a simple circuit structure, but operates at relatively low speed.

SUMMARY OF THE INVENTION

The present invention provides a successive approximation register analog-to-digital converter with an improved operating speed and improved reliability of analog-to-digital conversion.

The present invention also provides an analog-to-digital converter for improving an operating speed without additional power consumption and without an increase in size.

Embodiments of the present invention provide methods for operating a successive approximation register analog-to-digital converter for converting input signals corresponding to a series of successive bits into digital data, the method including: latching input signals which respectively correspond to bits of a first series of bits as digital data by directly transmitting the input signals to a latch; latching input signals which respectively correspond to bits of a second series of bits as digital data by transmitting the input signals to the latch after amplifying the input signals during a first period of amplification by using a preamplifier; and latching input signals which respectively correspond to bits of a third series of bits as digital data by transmitting the input signals to the latch after amplifying the input signals during a second period of amplification by using the preamplifier.

In other embodiments of the present invention, successive approximation register analog-to-digital converters include a digital-to-analog converter configured to sample an analog input signal and output the sampled signal as a differential signal; a comparator configured to output a comparison signal by detecting a level difference of the differential signal and latching the differential signal, wherein the differential signal is directly latched when the level of the differential signal is higher than a reference value, or the differential signal is amplified and then is latched when the level of the differential signal is lower than the reference value; and a successive approximation logic circuit configured to determine bits corresponding to the analog input signal according to the comparison signal.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

The above-described background and the following detailed description are exemplarily provided for describing the claimed invention. Therefore, the present invention may be embodied in different forms and should not be constructed as limited to the embodiments set forth herein. Rather, these embodiments are provided so that this disclosure will be thorough and complete, and will fully convey the scope of the present invention to those skilled in the art.

In the description, when it is described that a certain part includes certain elements, the part may further include other elements. Further, the embodiments exemplified and described herein include complementary embodiments thereof. Hereinafter, the embodiments of the present invention will be described in detail with reference to the accompanying drawings.

A successive approximation register analog-to-digital converter (SAR ADC) receives attention as a suitable converter for 8 to 16 bit resolution and conversion speed of about 5 to 100 MS/s. Further, the SAR ADC consumes low power. Thus, the SAR ADC is considered as a next-generation high efficiency data converter.

An operation of the SAR ADC may be typically divided into a sampling operation and a data conversion operation. Specifically, the data conversion operation may be subdivided into three operations of settling a digital-to-analog converter (DAC), amplification of a pre-amplifier, and latching of a latch. These operations of the SAR ADC should be performed by as much as a minimum resolution. Therefore, it is not easy to apply the SAR ADC to a technical field requiring high-speed operation.

Figure 1:
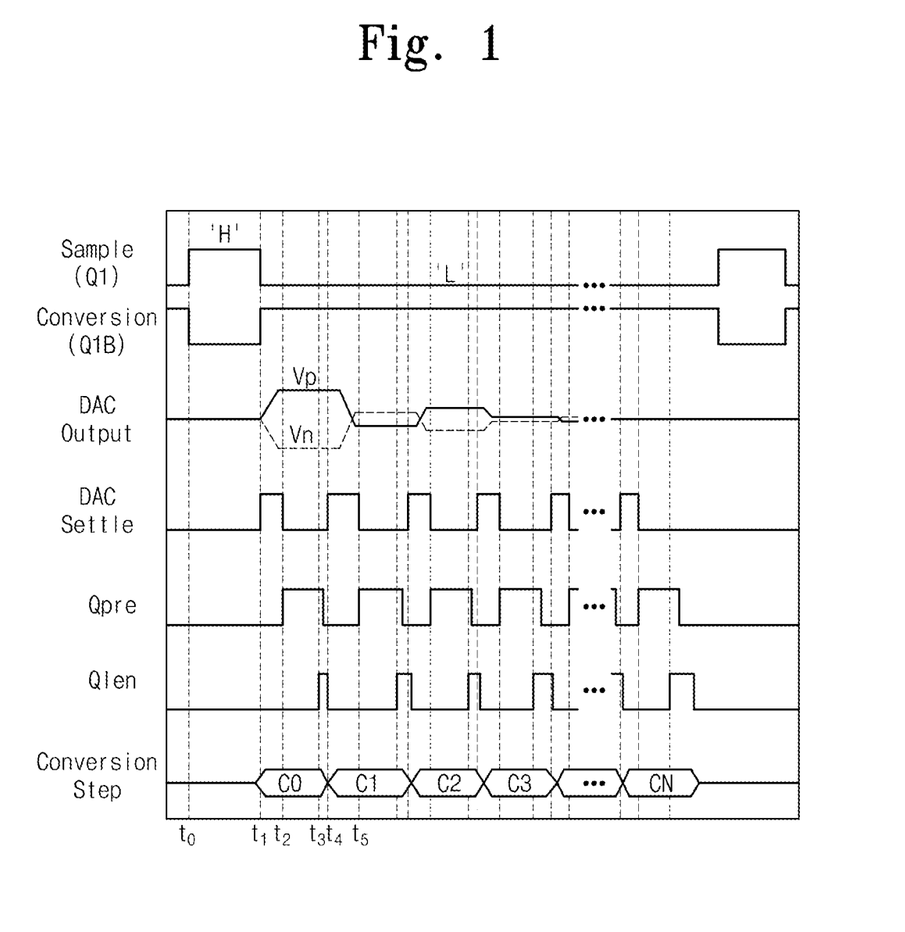
FIG. 1 is a timing diagram exemplarily illustrating an operation of a SAR ADC.

FIG. 1 is a timing diagram exemplarily illustrating the operation of the SAR ADC. A sampling operation performed by a DAC constituting the SAR ADC, and a data conversion operation performed by a preamplifier and a latch will be described in detail with reference to FIG. 1. Herein, the preamplifier and the latch may constitute a comparator.

At a period of t0 to t1 where a sampling clock Q1 is activated, an analog input voltage Vin provided is sampled by a plurality of sampling means. When the sampling clock Q1 is inactivated, a data conversion clock Q1B is activated. Preferably, the sampling clock Q1 and the data conversion clock Q1B may be complementary to each other.

When the data conversion clock Q1B is activated, settling of the DAC is started. During a settling period of t1 to t2 for the DAC, the DAC outputs the analog input voltage Vin as complementary first and second voltages Vn and Vp sampled to stable levels. Herein, for the SAR ADC to perform a conversion operation without an error during a period of data conversion, the settling time of the DAC should be sufficiently long. If the preamplifier or latch is operated when the settling of the DAC is not completed, errors may occur. An optimum period of time for operating the SAR ADC should be allocated for the settling of the DAC.

When the settling of the DAC is completed at a point of time t2, the preamplifier is operated. A DAC output provided by the DAC is transmitted to the preamplifier. The DAC output may be provided as the complementary first and second voltages Vn and Vp. For minimizing side effects caused by a kick-back phenomenon and offset of the latch, and for amplifying an output signal of the DAC, the preamplifier is necessary. However, due to frequency characteristics and voltage gain characteristics of the preamplifier, a period of time for amplification of the preamplifier should be longer than a certain time. As a result, it takes a longer time to convert data. However, for operations without errors, a certain amount of time should be allocated for the preamplifier.

After the operation of the preamplifier, the latch is activated at a point of time t3. The signal amplified by the preamplifier is separated into a digital signal by a latch. When a signal inputted from the preamplifier has a high level, an operating time of the latch may be set short. On the contrary, when the signal inputted from the preamplifier has a low level, an asynchronous clock technique may be used for lengthening the operating time of the latch. By using this asynchronous clock technique, the total data conversion time may be reduced.

A typical SAR ADC is limited in operating speed because repeated operations are performed during the data conversion period (activation period of Q1B). The operating speed may be partly improved by asynchronously configuring the operations of the latch. However, since the period of amplification time (activation period of Qpre) of the preamplifier should be kept constant, the operating speed improvement is still limited. Further, since the preamplifier is continuously operated under a certain condition during the conversion period of all data, overall power consumption of the ADC increases. Moreover, an additional circuit is required to apply the asynchronous technique, causing a greater size of hardware and increase in power consumption.

Figure 2:
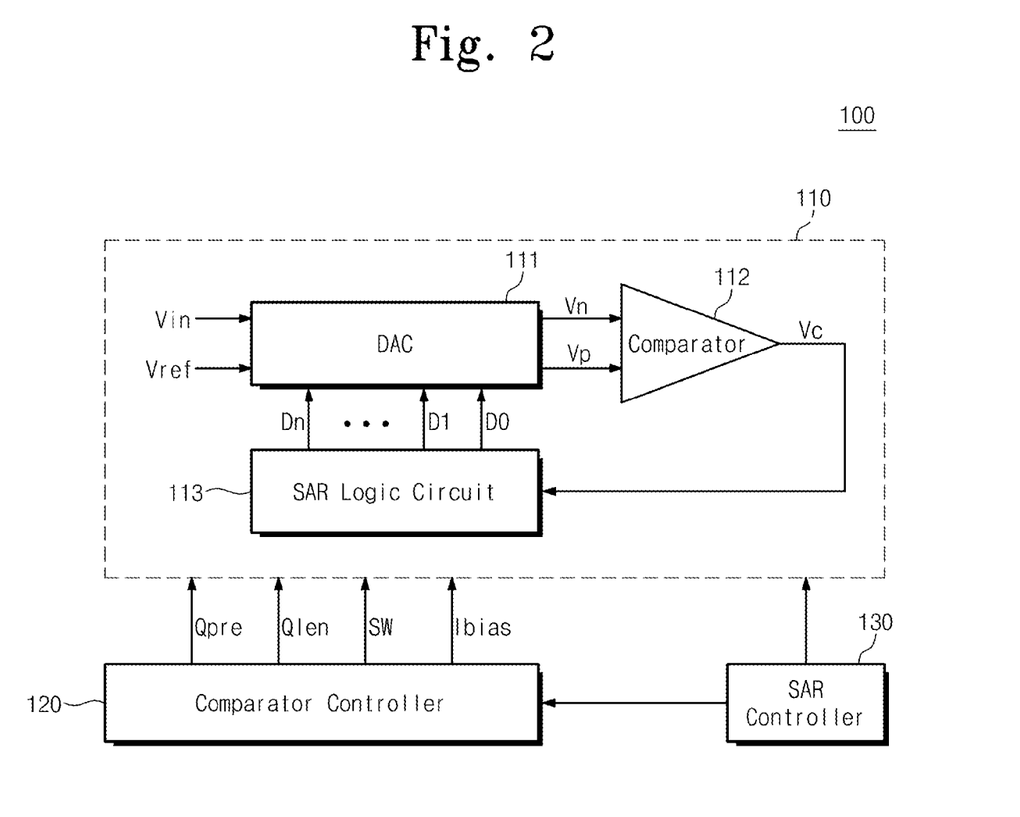
FIG. 2 is a block diagram illustrating a SAR ADC according to an embodiment of the present invention.

FIG. 2 is a block diagram illustrating a SAR ADC 100 according to an embodiment of the present invention. Referring to FIG. 2, the SAR ADC 100 includes a digital conversion unit 110, a comparator controller 120, and a SAR controller 130.

The digital conversion unit 110 receives control signals Qpre, Qlen, SW, and Ibias from the comparator controller 120. The digital conversion unit 110 converts an analog input voltage Vin into a digital signal in response to the control signals Qpre, Qlen, SW, and Ibias. The digital conversion unit 110 includes a digital-to-analog converter (DAC) 111, a comparator 112, and a SAR logic circuit 113.

The DAC 111 receives the analog input voltage Vin and a reference voltage Vref, and samples the analog input voltage Vin. The DAC 111 receives digital bits D0 to Dn from the SAR logic circuit 113, and generates first and second level voltages Vn and Vp in response to the digital bits D0 to Dn. The DAC 111 may be constituted of a plurality of capacitors having different capacitances and a plurality of switches.

The comparator 112 receives the first and second level voltage Vn and Vp from the DAC 111. The comparator 112 compares magnitudes of the first and second level voltages, and outputs a comparison signal Vc having a logic high or low level. Although not illustrated in the drawing, the comparator 112 may be constituted of a preamplifier and a latch.

The SAR logic circuit 113 receives the comparison signal Vc to determine values of the digital bits D0 to Dn.

The comparator controller 120 generates the control signals Qpre, Qlen, SW, and Ibias for controlling sampling operations and digital conversion operations of the digital conversion unit 110, and the SAR controller 130 controls an overall operation of the SAR ADC 100.

Herein, according to the SAR ADC 100 of the present invention, the operating time of the preamplifier and latch may be efficiently allocated by using the control signals Qpre, Qlen, SW, and Ibias. By virtue of this allocation of the operating time, the data conversion time may be reduced, thereby improving the operating speed of the SAR ADC. Further, according to the SAR ADC 100 of the present invention, the preamplifier may be efficiently operated and power consumption may be reduced. Moreover, even though the overall data conversion time is reduced, the occurrence of errors may be minimized.

Figure 3:
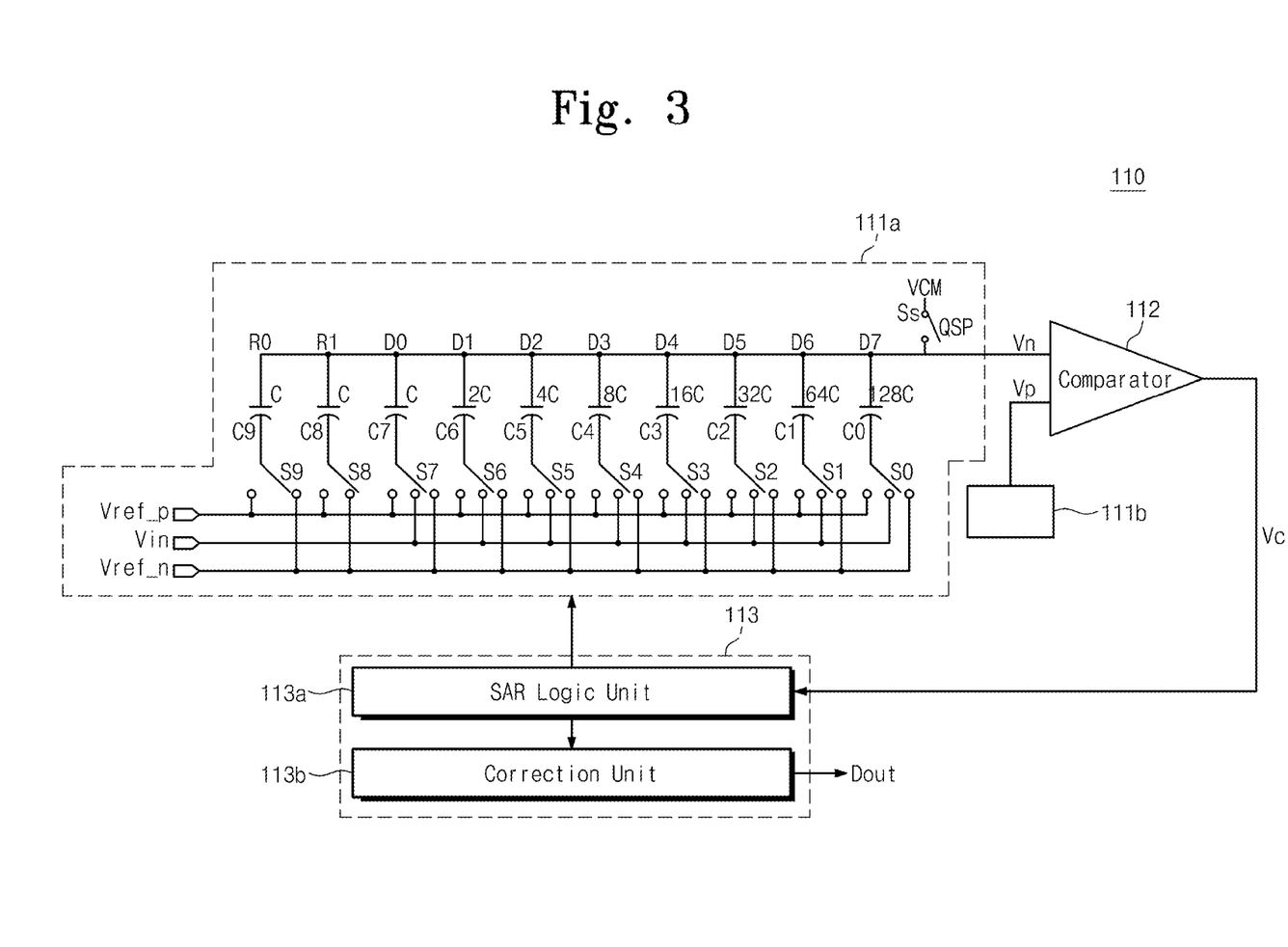
FIG. 3 is a block diagram illustrating a detailed structure of the SAR ADC illustrated in FIG. 2.

FIG. 3 is a block diagram illustrating a detailed structure of the digital conversion unit 110 illustrated in FIG. 2. Referring to FIG. 3, the digital conversion unit 110 includes a first conversion line 111a, a second conversion line 111b, the comparator 112, and the SAR logic circuit 113.

The first conversion line 111a includes a plurality of capacitors C0 to C9, and is connected to a first input terminal of the comparator 112. The number of the capacitors included in the first conversion line 111a is determined according to a resolution. Hereinafter, it is assumed that the first conversion line has an 8-bit resolution. The first conversion line 111a may include eight capacitors C0 to C7 corresponding to the 8-bit resolution and two correcting capacitors C8 and C9. Although not illustrated in the drawing, additional correcting capacitors may be further included.

Each one terminal of the ten capacitors C0 to C9 of the first conversion line 111a is connected to the first input terminal of the comparator 112, and provides the first voltage Vn. Each of the other terminals of the ten capacitors C0 to C9 may be selectively connected to a first reference voltage Vref_p, second reference voltage Vref_n, or input analog voltage Vin via switches S0 to S9. The eight capacitors C0 to C7 are defined as from a least significant bit (LSB) to a most significant bit (MSB) according to respective bits corresponding to the eight capacitors C0 to C7. The relative capacitance of the first capacitor C0 corresponding to the MSB may be about 128 C, the relative capacitance of the second capacitor C1 corresponding to the next bit may be about 64 C, and the relative capacitance of the third capacitor C2 may be about 32 C. Further, the relative capacitance of the fourth capacitor C3 may be about 16 C, the relative capacitance of the fifth capacitor C4 corresponding to the next bit may be about 8 C, and the relative capacitance of the sixth capacitor C5 may be about 4 C. The relative capacitance of the seventh capacitor C6 corresponding to the LSB may be about 2 C, and the relative capacitance of the eighth capacitor C7 may be about 1 C.

Each capacitance of the correcting capacitors C8 and C9 is the same as that of the eighth capacitor C7 corresponding to the LSB. The second conversion line 111b has the same structure as the first conversion line 111a, and ten capacitors of the second conversion unit 111b are connected to a second input terminal of the comparator 112 to provide the second voltage Vp. However, the second conversion line 111b is connected to a power source of which polarity is opposite to that of the first conversion line 111a.

The comparator 112 is provided with the first and second voltages Vn and Vp through the first and second input terminals. The first and second input terminals are respectively connected to the first and second conversion lines 111a and 111b. The comparator 112 outputs the output voltage Vc to a SAR logic unit 113a of the SAR logic circuit 113 in a high or low level state according to a differential voltage between the first and second voltages Vn and Vp applied through the first and second input terminals.

The SAR logic circuit 113 includes the SAR logic unit 113a and a correction unit 113b. The SAR logic unit 113a controls the switches S0 to S9 corresponding to the capacitors C0 to C9. The digital signals D0 to D7 respectively corresponding to the capacitors C7 to C0 are sequentially transmitted to the comparator 112 as values of levels of the first voltage Vn. Correcting digital signals R0 and R1 which respectively correspond to the correcting capacitors C9 and C8 are also transmitted to the comparator 112 as the values of the levels of the first voltage Vn. As described above, the comparator 112 outputs the output voltage Vc which corresponds to the digital signals D0 to D7, R0, and R1 transmitted from the capacitors C0 to C9. The SAR logic unit 113a receives the output voltage Vc from the comparator 112, converts the received voltage into the digital signals D0 to D7 and correcting digital signals R0 and R1, and transmits the converted signals to the correction unit 113b.

The correction unit 113b receives, from the SAR logic unit 113a, the digital signals D0 to D7 converted from the input analog voltage Vin and the converted correcting digital signals R0 and R1 of the correcting capacitors C8 and C9, corrects the digital signals D0 to D7 according to the correcting digital signals R0 and R1, and then outputs the corrected signals.

For convenience, a series of binary capacitors is used for configuring the digital conversion unit 110. However, the present invention is not limited thereto. It may be understood that the digital conversion unit 110 may be constituted of, for example, a converter including a split capacitor and a resistor, and a converter including a series of unit capacitors.

Figure 4:
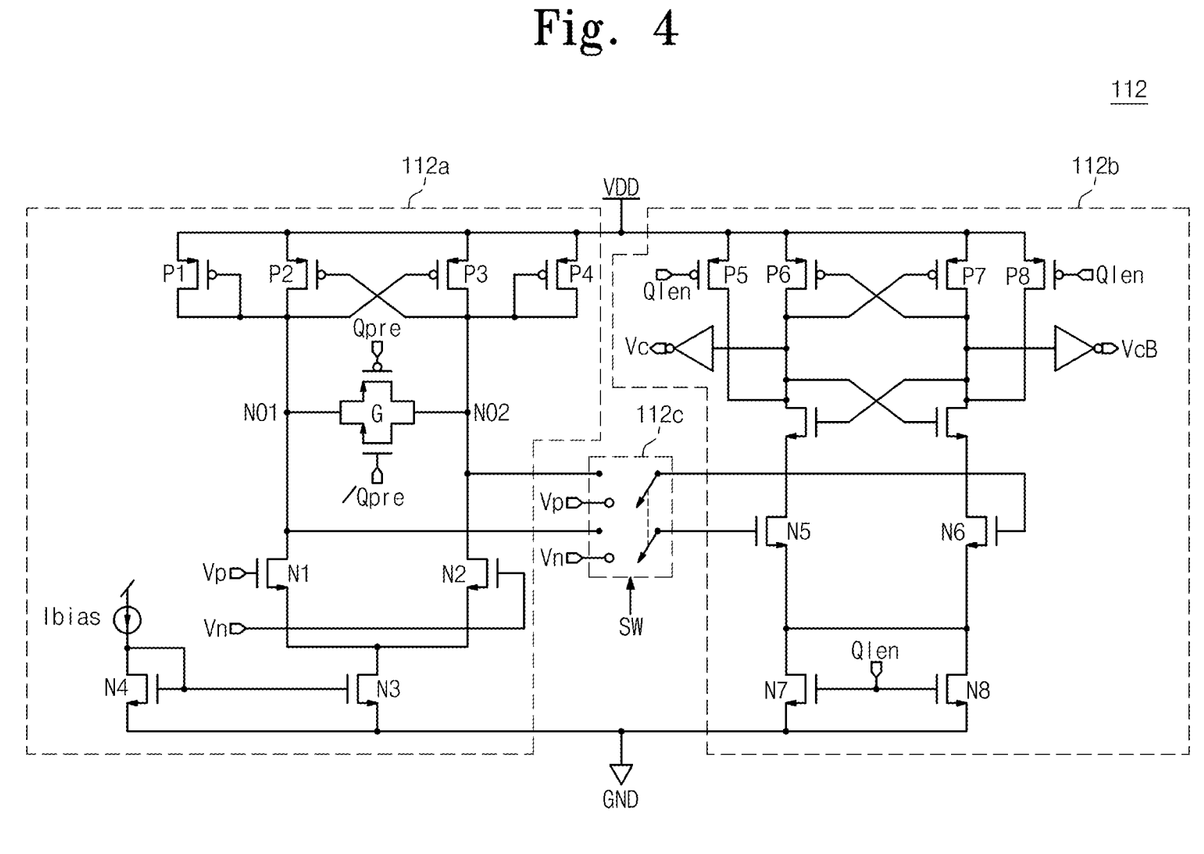
FIG. 4 is a circuit diagram illustrating a comparator illustrated in FIG. 3 according to the embodiment of the present invention.

FIG. 4 is a circuit diagram illustrating the comparator illustrated in FIG. 3 according to an embodiment of the present invention. Referring to FIG. 4, the comparator 112 includes a preamplifier 112a, a latch 112b, and a switch 112c.

The preamplifier 112a starts an amplification operation when the control signals Qpre and /Qpre are activated. When the control signals Qpre and /Qpre are activated, a switch G of the preamplifier 112a is cut off, and two nodes NO1 and NO2 are electrically separated from each other. The first and second voltages Vn and Vp transmitted from the DAC 111 are inputted to the gate terminals of NMOS transistors N1 and N2. The differential voltage between the inputted first and second voltages Vn and Vp is amplified by the preamplifier 112a and is transmitted to the latch 112b through the two nodes NO1 and NO2.

In particular, in the preamplifier 112a of the present invention, a power gain is adjustable by virtue of a bias current Ibias which is provided by using a current mirror technique. For example, when the preamplifier 112 does not need to be operated, the bias current may be cut off or minimally provided. For increasing the power gain and bandwidth of the preamplifier, the bias current Ibias may be gradually increased.

The latch 112b latches the differential voltage amplified by the preamplifier 112a as a digital signal, or latches the first and second voltages Vn and Vp not processed by the preamplifier 112a as digital signals. When the control signal Qlen is activated, PMOS transistors P5 and P8 and NMOS transistors N7 and N8 are turned on so that the 112b is enabled. Then, the latch 112b may latch and output a differential signal transmitted to the gates of NMOS transistors N5 and N6. The latch 112b may latch a logic value '1' when the first voltage Vn is greater than the second voltage Vp, and may latch a logic value '0' when the first voltage Vn is smaller than the second voltage Vp.

The switch 112c transmits an output of the preamplifier 112a to the latch 112b when the preamplifier 112a is enabled. However, the switch 112c is allowed to directly transmit the first and second voltages Vn and Vp to the latch 112b when the preamplifier 112a is disabled. The switch 112c is controlled in response to the control signal SW provided by the comparator controller 120.

Figure 5:
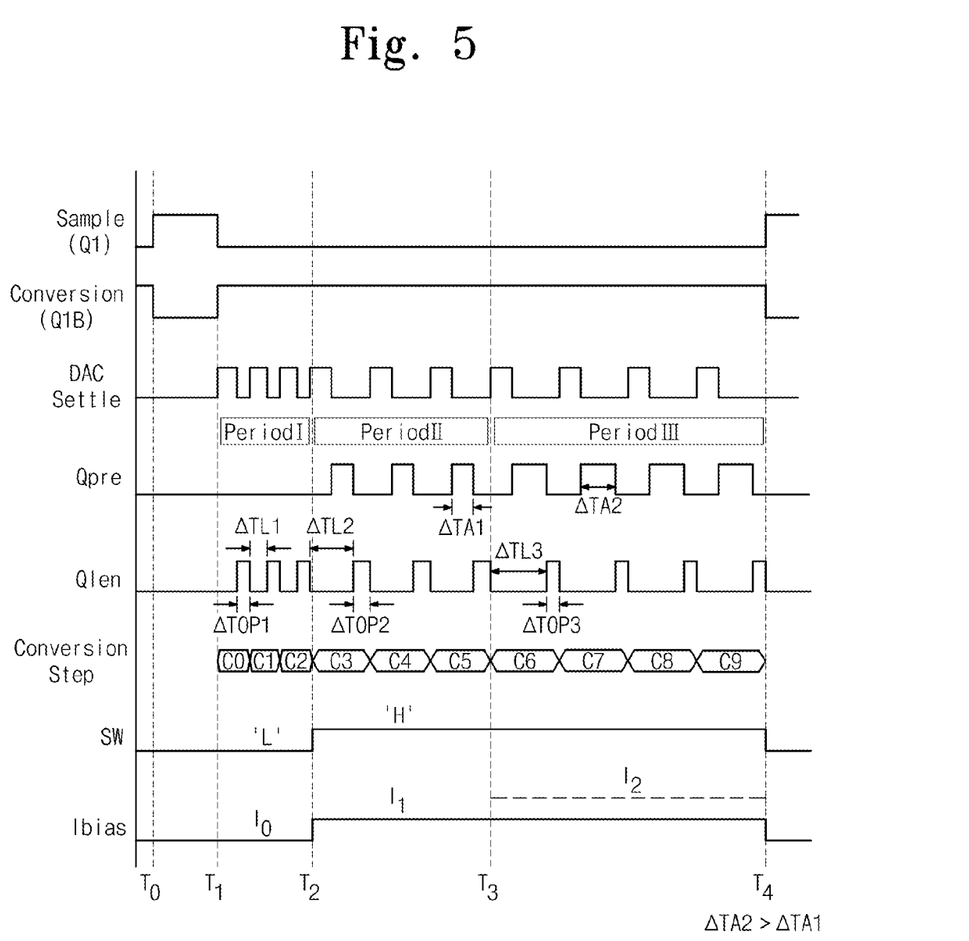
FIG. 5 is a timing diagram illustrating an operation of the SAR DAC according to the embodiment of the present invention.

FIG. 5 is a timing diagram illustrating an operation of the SAR DAC according to the embodiment of the present invention. Referring to FIG. 5, an operation of the comparator 112 for improving the speed of data conversion and reducing power consumption is started. With reference to FIG. 4 which illustrates the preamplifier 112a, latch 112b, and switch 112c included in the comparator 112, operations of the present invention will be described.

At a period of T0 to T1 where a sampling clock Q1 is activated, the analog input voltage Vin provided is sampled by a plurality of sampling means. When the sampling clock Q1 is inactivated, a data conversion clock Q1B is activated. Preferably, the sampling clock Q1 and the data conversion clock Q1B may be complementary to each other.

At the period where the data conversion clock Q1B is activated, the data conversion operation may be divided into three operations. That is, at a first conversion period (Period I), an output of the DAC 111 is directly received by the latch 112b without operating the preamplifier 112a. At a second conversion period (Period II), which follows the first conversion period, although the preamplifier 112a is operated to amplify the output of the DAC 111, the amplification time is minimized and the amplified signal is transmitted to the latch 112b. At a third period (Period III), which follows the second period, the amplification time of the preamplifier 112 is maximized to reduce errors. These operations are described in detail below.

When the data conversion clock Q1B is activated at a point of time T1, the preamplifier 112a is turned off, and the output of the DAC 111 is directly passed to the latch 112b at the first conversion period. Exemplarily, it is assumed that bits for the data (C0 to C2) corresponding to the MSB are determined at the first conversion period.

At the first conversion period, the control signals Qpre and Ibias are not provided. The control signal Qpre which defines an amplification period of the preamplifier 112a is cut off, and the bias current Ibias which defines the power gain of the preamplifier 112a is also cut off (current value $I_0$). That is, at the first conversion period, the preamplifier 112a is turned off to be disabled. And, to directly transmit the output of the DAC 111 to the latch 112b, the switch 112c is such operated as to transmit not the output of the preamplifier 112a but the output of the DAC 111 to the latch 112*b*. A logic 'L' state of the control signal SW represents that the switch 112*c* is allowed to transmit the output of the DAC 111 to the latch 112*b*.

At the first conversion period, the latch 112*b* may latch the output of the DAC 111, which is directly inputted, at high speed. A latch interval $\Delta TL1$ and a latch operation period $\Delta TOP1$ at the first conversion period are illustrated. Since the output of the DAC 111 is allowed to have a relatively high level, the latch operation may be performed at high speed at the first conversion period.

The reason why the preamplifier 112*a* may be turned off at the first conversion period is that the output voltages Vn and Vp of the DAC 111 are relatively high during an initial data conversion operation. Therefore, without the amplifying operation of the preamplifier 112*a*, digital data may be latched without serious errors. It is known that the effective number of bits (ENOB) of 7 or higher may be obtained without a preamplifier in a SAR ADC having about an 8-bit resolution. Therefore, by allowing the output voltages Vn and Vp of the DAC 111, which correspond to initial several bits (for example, MSB), to bypass the preamplifier 112*a* and directly arrive at the latch 112*b*, the amplification time of the preamplifier 112*a* may be saved.

After the first conversion period, the second conversion period starts. After the data conversion operation is performed on several bits (for example, C0 to C2) at the first conversion period, the levels of the output voltages Vn and Vp of the DAC 111 are reduced. In the case of converting the output voltages Vn and Vp of the DAC 111 into digital data by only using the latch 112, an error rate may inevitably increase. Therefore, the output voltages Vn and Vp of the DAC 111 needs to be amplified by the preamplifier 112*a*.

At the second conversion period, the control signals Qpre and Ibias are provided to the preamplifier 112*a*. And, the control signal SW for the switch 112*c* transitions to a logic 'H' state so as to transmit the signal amplified by the preamplifier 112*a* to the latch 112*b*. Firstly, to increase the power gain of the preamplifier 112*a*, the bias current Ibias is allowed to have a current value $I_1$. Thereafter, the control signal Qpre is allowed to have a pulse width of an activation period $\Delta TA1$ so as to enable the preamplifier 112*a*. Thereafter, the latch 112*b* is provided with the latch enable signal Qlen to latch the output of the preamplifier 112*a* as digital data. The activation period of the latch enable signal Qlen becomes longer at the second conversion period than at the first conversion period, considering the amplification time of the preamplifier 112*a*. According to this operation, bit determination may be performed on the data C3 to C5 at the second conversion period.

At the second conversion period, the bias current Ibias is provided so that the preamplifier 112*a* amplifies the output voltages Vn and Vp with a minimum amplification time $\Delta TA1$. The bias current Ibias for minimizing errors and reducing the amplification time of the preamplifier 112*a* is provided at the second conversion period.

After the second conversion period, the third conversion period for determining the LSB data C6 to C9 starts. After the data conversion operation is performed on several bits (for example, C3 to C5) at the second conversion period, the levels of the output voltages Vn and Vp of the DAC 111 are more reduced at the third conversion operation.

An amplification time $\Delta TA2$ of the preamplifier 112*a* at the third conversion period may be sufficiently longer than the amplification time $\Delta TA1$ at the second conversion period so as to compensate for the reduced output voltages Vn and Vp of the DAC 111. In addition, the increase in the amplification time $\Delta TA2$ causes an increase in the latch interval $\Delta TL3$ of the latch 112*b*. Further, during the third conversion period, the bias current Ibias may be increased to have a current value $I_2$ to increase the power gain of the preamplifier 112*a*.

The reason why the amplification time may be sufficiently increased at the third conversion period is that the time is saved at the previous first and second conversion periods. During the third conversion period, the control signals Qpre and Ibias are provided to the preamplifier 112*a*. And, the control signal SW for the switch 112*c* maintains a logic 'H' state to transmit the signal amplified by the preamplifier 112*a* to the latch 112*b*. The bias current Ibias for the power gain of the preamplifier 112*a* may maintain the current value $I_1$. Or, the bias current Ibias may be increased to the current value $I_2$ to set the power gain of the preamplifier 112*a* higher than at the second conversion period. Thereafter, the control signal Qpre is allowed to have a pulse width of an activation period $\Delta TA2$ so as to enable the preamplifier 112*a*. Thereafter, the latch 112*b* is provided with the latch enable signal Qlen to latch the output of the preamplifier 112*a* as digital data. The activation period of the latch enable signal Qlen becomes longer at the third conversion period than at the second conversion period according to the increase in the amplification time of the preamplifier 112*a*. When the overall data conversion of the LSB data C6 to C9 is completed, the data conversion clock Q1B is inactivated.

The operation of the SAR ADC according to the present invention has been described under the assumption of 8-bit resolution. However, it would be well understood that all of the first to three conversion operations may be applied or a combination of any two of the conversion operations may be applied according to the resolution. Further, although the preamplifier 112*a* is configured as a single stage in the embodiment of the present invention, a multistage preamplifier may be used so that the levels of the signals inputted to the latch 112*b* remain constant during the first to third conversion periods. Therefore, since the operation period of the latch may be kept constant, the latch 112*b* may be operated by using a synchronous latch clock. As a result, an additional configuration for generating an asynchronous clock is not required. Therefore, according to the embodiment of the present invention, a synchronous SAR ADC with reduced hardware complexity may be provided.

Figure 6:
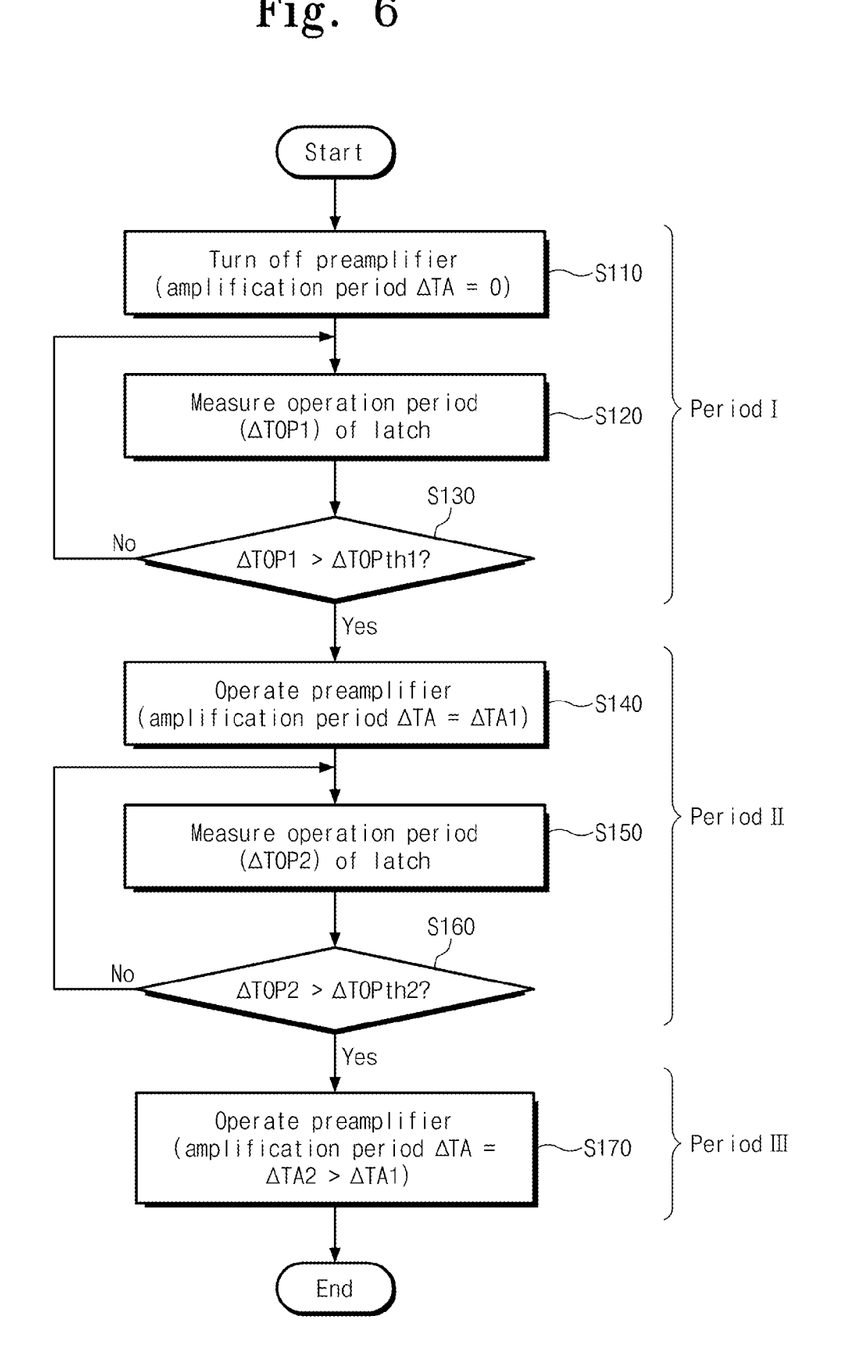
FIG. 6 is a flowchart illustrating the operation of the SAR DAC according to the embodiment of the present invention.

FIG. 6 is a flowchart for describing the data conversion operation of the SAR ADC 110 illustrated in FIG. 3. Referring to FIG. 6, in particular, processes for setting the amplification time of the preamplifier 112*a* according to the operating time of the latch 112 will be described. When the data conversion clock Q1B is activated, the data conversion operation is started.

In operation S110, the preamplifier 112*a* is turned off. For instance, the preamplifier 112*a* is such set that the amplification time for amplifying a signal becomes 0 ($\Delta TA=0$). And, the switch 112*c* is such controlled that the output signals Vn and Vp of the DAC 111 are directly passed to the latch bypassing the preamplifier 112*a*.

In operation S120, the operation period $\Delta TOP1$ of the latch 112*b* is measured. It may be detected when the state of the latch 112*b* is changed by using the output signals Vn and Vp of the DAC 111 transmitted thereto. The operation period of the latch 112*b* means a period of time in which the latch 112*b* is enabled.

In operation S130, it is detected whether the operation period $\Delta TOP1$ of the latch 112*a* exceeds a first reference value $\Delta TOPth1$. When the operation period $\Delta TOP1$ of the latch 112*a* is shorter than the first reference value $\Delta TOPth1$, the preamplifier 112*a* is still turned off for the remaining data conversion operations. That is, the process returns to operation S120. On the contrary, when the operation period $\Delta TOP1$ of the latch 112a exceeds the first reference value ΔTOPth1, the process moves on to operation S140 to turn on the preamplifier 112a for the remaining data conversion operations.

In operation S140, the preamplifier 112a is turned on. For instance, the preamplifier 112a may be such set that the amplification time taken for amplifying signals becomes ΔTA1 (ΔTA=ΔTA1). And, the switch 112c is such controlled that the output signals Vn and Vp of the DAC 111 are provided to the latch via the preamplifier 112a.

In operation S150, the operation period ΔTOP2 of the latch 112b is measured. It may be detected when data are stored in the latch 112b by using the output signals Vn and Vp of the DAC 111 transmitted thereto.

In operation S160, it is detected whether the operation period ΔTOP2 of the latch 112b exceeds a second reference value ΔTOPth2. When the operation period ΔTOP2 of the latch 112b is shorter than the second reference value ΔTOPth2, the amplifying period ΔTA1 is still applied for the remaining data conversion operations. That is, the process returns to operation S150. On the contrary, when the operation period ΔTOP2 of the latch 112b exceeds the second reference value ΔTOPth2, the process moves on to operation S170 to apply an increased amplifying period for the remaining data conversion operations.

In operation S170, the preamplifier 112a processes the output signals Vn and Vp of the DAC 111 and transmits the processed signals to the latch 112b during the increased amplifying period ΔTA2.

The successive approximation register analog-to-digital converter according to the embodiment of the present invention can improve the speed of analog-to-digital conversion operation by optimizing the operation of the latch and improve the reliability of the analog-to-digital conversion operation.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for operating a successive approximation register analog-to-digital converter for converting input signals corresponding to a series of successive bits into digital data, the method comprising:
    latching first input signals which respectively correspond to bits of a first series of bits as digital data by directly transmitting the first input signals to a latch;
    latching second input signals which respectively correspond to bits of a second series of bits as digital data by transmitting the second input signals to the latch after amplifying the second input signals during a first period of amplification by using a preamplifier; and
    latching third input signals which respectively correspond to bits of a third series of bits as digital data by transmitting the third input signals to the latch after amplifying the third input signals during a second period of amplification by using the preamplifier,
    wherein the second period of amplification is longer than the first period of amplification.

2. The method of claim 1, wherein the preamplifier is disabled during the latching of the first input signals by directly transmitting the input signals to the latch.

3. The method of claim 1, wherein the first series of bits is designated as most significant bits (MSB) of the series of successive bits.

4. The method of claim 1, wherein a power gain of the preamplifier is increased during the latching of the second input signals or during the latching of the third input signals.

5. The method of claim 1, further comprising directly providing the input signals to the latch without passing through the preamplifier.

6. The method of claim 1, wherein the input signals are provided as differential signals generated by a digital-to-analog converter.

7. The method of claim 1, wherein the first period of amplification is set with reference to a latch operating time during the latching of the first input signals, and the second period of amplification is set with reference to a latch operating time during the latching of the second input signals.

8. A successive approximation register analog-to-digital converter comprising:
    a digital-to-analog converter configured to sample an analog input signal and output the sampled signal as a differential signal;
    a comparator configured to output a comparison signal by detecting a level difference of the differential signal and latching the differential signal, wherein the differential signal is directly latched when the level of the differential signal is higher than a reference value, or the differential signal is amplified and then is latched when the level of the differential signal is lower than the reference value; and
    a successive approximation logic circuit configured to determine bits corresponding to the analog input signal according to the comparison signal,
    wherein the comparator comprises:
        a preamplifier configured to amplify the differential signal in response to a control signal;
        a latch configured to latch the differential signal or an output of the preamplifier; and
        a switch configured to directly pass the differential signal to the latch at a period of time where the preamplifier is disabled.

9. The successive approximation register analog-to-digital converter of claim 8, wherein the control signal disables the preamplifier when the level of the differential signal is higher than the reference value.

10. A successive approximation register analog-to-digital converter comprising:
    a digital-to-analog converter configured to sample an analog input signal and output the sampled signal as a differential signal;
    a comparator configured to output a comparison signal by detecting a level difference of the differential signal and latching the differential signal, wherein the differential signal is directly latched when the level of the differential signal is higher than a reference value, or the differential signal is amplified and then is latched when the level of the differential signal is lower than the reference value; and
    a successive approximation logic circuit configured to determine bits corresponding to the analog input signal according to the comparison signal,
    wherein the comparator comprises:
        a preamplifier configured to amplify the differential signal in response to a control signal; and
        a latch configured to latch the differential signal or an output of the preamplifier, and wherein the control signal is such provided that a period of amplification time of the preamplifier is changed to amplify the differential signal when the level of the differential signal is lower than the reference value.

11. The successive approximation register analog-to-digital converter of claim 10, wherein a bias current for increasing a power gain of the preamplifier is provided when the level of the differential signal is lower than the reference value.

* * * * *